(12) United States Patent  
Feng et al.

(10) Patent No.: US 7,763,791 B2
(45) Date of Patent: Jul. 27, 2010

(54) THIN FILM WITH ORIENTED CRACKS ON A FLEXIBLE SUBSTRATE

(75) Inventors: Bao Feng, Dunlap, IL (US); Andrew McGilvray, East Peoria, IL (US); Bo Shi, Peoria Heights, IL (US)

(73) Assignee: Caterpillar Inc, Peoria, IL (US)

( * ) Notice: Subject to any disclaimer, the term of this patent is extended or adjusted under 35 U.S.C. 154(b) by 740 days.

(21) Appl. No.: 11/647,137

(22) Filed: Dec. 29, 2006

(65) Prior Publication Data

US 2008/0156364 A1 Jul. 3, 2008

(51) Int. Cl.
*H01L 35/00* (2006.01)
*H01L 35/16* (2006.01)
*H01L 35/22* (2006.01)
*H01L 35/14* (2006.01)

(52) U.S. Cl. ............ 136/200; 136/205; 136/238; 136/239; 136/240

(58) Field of Classification Search ......... 136/200–242; 438/54–55; 310/306
See application file for complete search history.

(56) References Cited

U.S. PATENT DOCUMENTS

| | | | |
|---|---|---|---|
| 3,554,815 A | * | 1/1971 | Osborn ............ 136/203 |
| 4,851,095 A | | 7/1989 | Scobey et al. |
| 4,868,071 A | | 9/1989 | Walsh et al. |
| 4,918,800 A | | 4/1990 | Reafler |
| 4,950,553 A | | 8/1990 | Walsh et al. |
| 4,992,144 A | | 2/1991 | Walsh et al. |
| 6,306,510 B1 | | 10/2001 | Verlinden et al. |
| 6,452,091 B1 | | 9/2002 | Nakagawa et al. |

FOREIGN PATENT DOCUMENTS

JP 2004241657 A * 8/2004

OTHER PUBLICATIONS

English machine translation of Sugiyama et al. (JP 2004-241657 A), published Aug. 2004.*
Fei, Dong, Taher, Mahmoud A., Feng, Bao, Wheat, Leonard George, Howe, Beth Ann, Thermoelectric Device, U.S. Appl. No. 11/490,135, filed Jul. 21, 2006 (25 pgs.).

* cited by examiner

*Primary Examiner*—Basia Ridley
*Assistant Examiner*—Christina Chern
(74) *Attorney, Agent, or Firm*—Finnegan, Henderson, Farabow, Garrett & Dunner

(57) ABSTRACT

A thermoelectric film is disclosed. The thermoelectric film includes a substrate that is substantially electrically non-conductive and flexible and a thermoelectric material that is deposited on at least one surface of the substrate. The thermoelectric film also includes multiple cracks oriented in a predetermined direction.

18 Claims, 4 Drawing Sheets

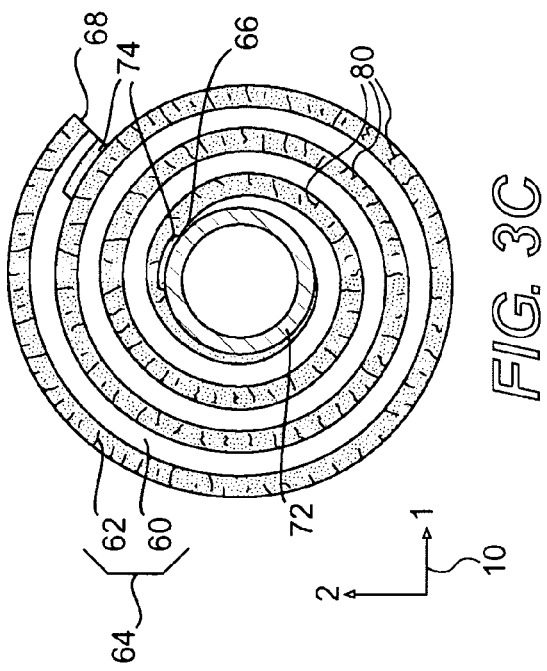
FIG. 3B
FIG. 3C
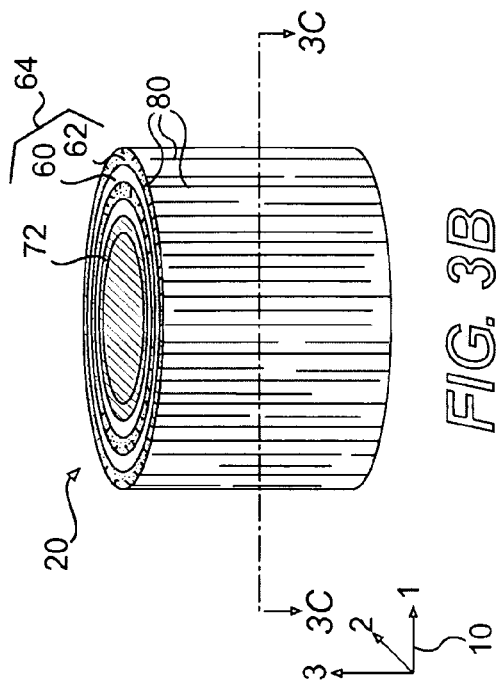
FIG. 3A

THIN FILM WITH ORIENTED CRACKS ON A FLEXIBLE SUBSTRATE

U.S. GOVERNMENT RIGHTS

This invention was made with government support under the terms of Contract No. ZCL-4-32060-04 awarded by the National Renewable Energy Lab. The government may have certain rights in this invention.

TECHNICAL FIELD

The present disclosure relates generally to a thin film with oriented cracks, and more particularly, to a thin film with oriented cracks deposited on a flexible substrate.

BACKGROUND

The possibility of increased packaging density and superior performance have created numerous applications for thin films on flexible substrates. In some of these applications, electrical circuits are formed on thin films which are deposited on flexible substrates while planar, and then folded or rolled into 3D package structures to increase microcircuit packing density. Flexible, in this context, refers to the ability of the substrate to be flexed (or bend) repeatedly without damaging the substrate. While the flexibility of the substrate material enables bending of the substrate, cracking of the thin film circuits due to flexure limits the durability of these flexible circuits. A crack in the thin film may increase electrical resistance of the thin film by decreasing the cross-sectional area available for the flow of current. The decrease in cross-sectional area available for current flow will depend upon the relative orientation of the crack with respect to the direction of current flow. If the crack is oriented parallel to the direction of current flow, the impact of the crack on current flow will be minimal. At other orientations, the crack will cause a larger increase in electrical resistance of the thin film.

The ductility of the thin film material deposited on the flexible substrate will dictate the amount of flexure a flexible circuit can tolerate before cracking occurs. While common conductors, such as copper and aluminum, have a high ductility, semiconductor materials and ceramic materials have a low ductility. The high ductility of common conductors enable thin films made of these materials to tolerate a moderate amount of flexure. However, the poor ductility (or high brittleness) of semiconductor and ceramic materials makes thin films of these materials (hereinafter referred to as 'brittle films') deposited on flexible substrates highly susceptible to cracking. In addition to increased susceptibility to crack initiation, the likelihood of crack propagation in brittle films is also higher.

One application of a brittle film on a flexible substrate is described in a co-pending application Ser. No. 11/490,135 ('135 application), filed on Jul. 21, 2006 titled "Thermoelectric Device" that is incorporated herein by reference. The '135 application discloses a thermoelectric thin film deposited on a flexible substrate that is wrapped around a support tube to create a thermoelectric element of a thermoelectric device. In such an application, the brittle nature of the thermoelectric material may induce cracks in the thermoelectric material during fabrication or winding. In a high volume environment, these and other similar films are typically deposited on a roll of flexible substrate within a deposition chamber. To enable deposition on a large area of the flexible substrate, the flexible substrate is bent (or otherwise flexed) within the deposition chamber. This bending of the flexible substrate with a deposited brittle film, cracks the brittle film. Even if a particular fabrication process minimizes flexure and associated cracking, handling of a flexible substrate with a deposited brittle film induces flexure and cracking of the film. These cracks typically propagate uncontrolled in random directions. Randomly oriented cracks may adversely impact the electrical characteristics of the film and decrease the durability of the film.

The present disclosure is directed at overcoming one or more of the shortcomings of the prior art thin films on flexible substrates.

SUMMARY OF THE INVENTION

In one aspect, the present disclosure is directed to a thermoelectric film. The thermoelectric film includes a substrate that is substantially electrically non-conductive and flexible, and a thermoelectric material that is deposited on at least one surface of the substrate. The thermoelectric film also includes multiple cracks oriented in a predetermined direction.

In another aspect, the present disclosure also discloses a method of making a thermoelectric film. The method includes depositing a first layer of a thermoelectric material on the flexible substrate. The method further includes bending the flexible substrate around a first axis to induce multiple cracks in the first layer of the thermoelectric material, wherein the multiple cracks are oriented in the direction of the first axis.

In yet another aspect, the present disclosure discloses a thermoelectric element which includes a support structure with a curved external surface. A thermoelectric film covers the external surface of the support structure. The thermoelectric film includes a flexible substrate and a thermoelectric material deposited on at least one surface of the flexible substrate. The thermoelectric material includes multiple cracks oriented substantially parallel to a direction of an electric current flow.

BRIEF DESCRIPTION OF THE DRAWINGS

FIG. 3A is a diagrammatic illustration of the structure of an exemplary thermoelectric element that may be used in the thermoelectric device of FIG. 2;

FIG. 3B is a diagrammatic illustration of an exemplary geometry of a thermoelectric element that may be used in the thermoelectric device of FIG. 2;

FIG. 3C is a cross-sectional view of the thermoelectric element along plane 3C-3C of FIG. 3B;

DETAILED DESCRIPTION

Figure 1:
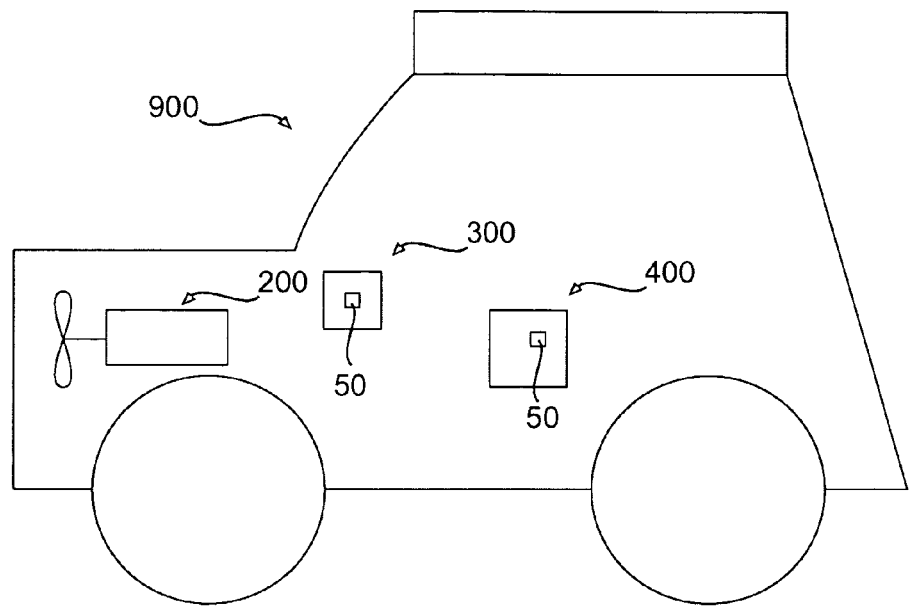
FIG. 1 is a diagrammatic illustration of an exemplary disclosed machine.

FIG. 1 illustrates an exemplary machine 900 having multiple systems and components that cooperate to accomplish a task. Machine 900 may embody a fixed or mobile machine that performs some type of operation associated with an industry such as mining, construction, farming, transportation, or any other industry known in the art. For example, machine 900 may be a transportation machine such as a car, train, or an airplane, an earth moving machine such as an excavator, a dozer, a loader, a backhoe, a motor grader, a dump truck, or any other machine. Machine 900 may include, among others, a power source 200, an HVAC system 300, and an exhaust system 400. The exhaust system 400, the HVAC system 300, and other systems of machine 900 may include one or more thermoelectric devices 50. The thermoelectric device 50 used in an exhaust system 400 uses the temperature difference between a hot region and a cold region to generate electric power. The hot region can be any hot source (including hot exhaust gases), and the cold region can be any cold source (including circulating cooling liquids and atmospheric air). The power generated by the thermoelectric device 50 may be used to help drive other systems of the machine 900. A thermoelectric device 50 used within an HVAC system 300 acts as a heat pump. In such an application, electric power is supplied to the thermoelectric device 50. The current drives a transfer of heat from one end of the thermoelectric device 50 to the other, creating a hot region and a cold region. The cold region may be used to cool (for example, air in a HVAC system), and/or the hot region may be used to warm (for example, oil or fuel) other parts or systems of the machine 900.

Although the thermoelectric device 50 is described for application in an exhaust system 400 and an HVAC system 300 of the machine 900, these descriptions are illustrative only. It is understood that the thermoelectric device 50 can be used anywhere where heat energy is to be converted to electrical energy or where electrical energy is to be used to create a temperature differential between two regions.

Figure 2:
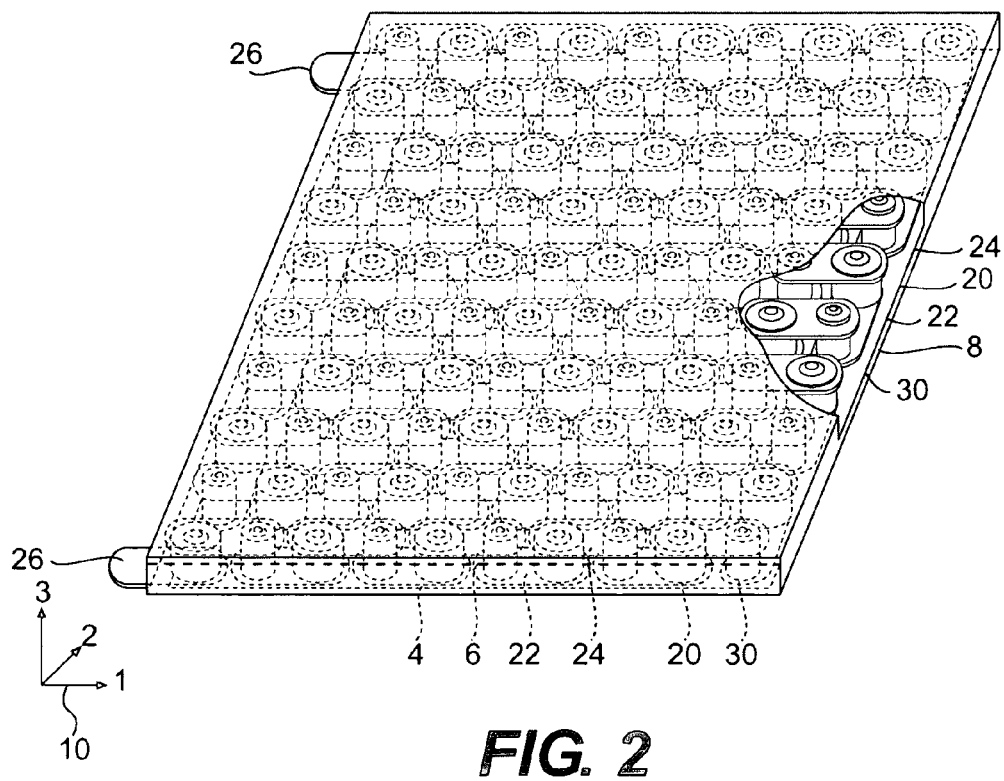
FIG. 2 is a diagrammatic illustration of an exemplary thermoelectric device that may be used in the machine of FIG. 1.

FIG. 2 is an diagrammatic illustration of a thermoelectric device 50 that may be used in the machine 900 of FIG. 1. Triad 10 with three mutually perpendicular axes 1, 2, and 3 are used to show the orientation of the thermoelectric device 50. The thermoelectric device 50 may be made up of a plurality of n-type thermoelectric elements 30 and p-type thermoelectric elements 20. Both n-type and p-type thermoelectric elements 30, 20 may each have a generally cylindrical surface and opposing substantially parallel end surfaces. The top and bottom parallel end surface of each thermoelectric element may be electrically connected to electrically conductive tabs. The top end surface of each n-type and p-type thermoelectric element 30, 20 may be connected to a top tab 24, and the bottom end surface of each n-type and p-type thermoelectric element 30, 20 may be connected to a bottom tab 22. The top and bottom tabs 24, 22 may be attached to facing surfaces of a top cover plate 6 and a bottom cover plate 4, respectively. In some applications, a housing 8 may enclose the top and bottom tabs 24, 22 and the thermoelectric elements.

The top and bottom tabs 24, 22 are used to electrically interconnect the n-type and p-type thermoelectric elements 30, 20. A bottom tab 22 may electrically connect the bottom end surface of one of the n-type thermoelectric elements 30 to the bottom end surface of an adjacent p-type thermoelectric element 20. A top tab 24 may electrically connect the top end surface of the same p-type thermoelectric element 20 to the top end surface of a different adjacent n-type thermoelectric element 30. The bottom end surface of this n-type thermoelectric element 30 may then be connected to the bottom end surface of a different adjacent p-type thermoelectric element 20. This interconnection pattern may be repeated until all the n-type and p-type thermoelectric elements 30, 20 are connected together serially. At least two electrically conductive leads 26 may electrically connect to the interconnected thermoelectric elements, and extent outside the housing. It should be noted that description of the thermoelectric device 50 is illustrative only. It is contemplated that other designs and interconnection schemes may be used to create the thermoelectric device 50.

FIGS. 3A, 3B, and 3C illustrate an exemplary geometry of a thermoelectric element used in the thermoelectric device 50 of FIG. 2. FIG. 3A shows the method of construction of a thermoelectric element, FIG. 3B shows the structure of the thermoelectric element, and FIG. 3C shows a cross-sectional view of the thermoelectric element through plane 3C-3C of FIG. 3B. Reference will be made to FIGS. 3A, 3B, and 3C in the description that follows. To explain the geometry of the thermoelectric elements, a p-type thermoelectric element 20 is described. The geometry of the n-type thermoelectric element 30 is identical to that of the p-type thermoelectric element 20. Differences in the materials of the n-type thermoelectric element 30 will be pointed out.

Thermoelectric material 62 of p-type, is deposited on a flexible substrate 60. The deposited thermoelectric material 62 may include a plurality of oriented cracks 80. The triad 10 with the three mutually perpendicular axes 1, 2, and 3 is shown to illustrate the orientation of the cracks 80 with respect to the thermoelectric element. The cracks 80 may oriented along the longitudinal axis of the thermoelectric element (that is, oriented along axis 3 of the triad 10). Any flexible substrate material may be used. Typically, a material which can survive high temperatures with low thermal and electrical conductivities are used for such an application. Such a substrate could include any polyimide, Kapton® tape or any other suitable flexible substrate. Any deposition technique, for example sputtering, can be used to deposit the thermoelectric material 62 on the flexible substrate 60. The method of creating the oriented cracks 80 will be described later.

Any thermoelectric material 62 can be deposited on the flexible substrate 60 to act either as a p-type or n-type thermoelectric element 20, 30. For example, different stochiometries of boron carbide, silicon carbide, silicon germanium, bismuth telluride, germanium telluride, or any other thermoelectric material known in the art may be used as the thermoelectric material 62. These materials can also have any structure including zero-dimensional quantum dots, one-dimensional nano wires, two-dimensional quantum wells and superlattice thermoelectric structures.

The deposited thermoelectric material 62 and the flexible substrate 60 together constitute the thermoelectric film 64. The thermoelectric film 64 includes two pairs of opposite edges—a first edge 66, a second edge 68, a third edge 67 and a fourth edge 69. The p-type thermoelectric element 20 is formed by winding the thermoelectric film 64 around a support structure 72 which may have low thermal and electrical conductivity. The support structure 72 may have any form. For example, the support structure 72 may have the form of a hollow tube. Hereinafter, the support structure 72 will be described as a hollow tube. Such a hollow tube may be formed of, for example, alumina or other suitable materials.

The first edge 66 of the thermoelectric film 64 may be attached, using an attachment medium 74 (see FIG. 3C), to the external cylindrical surface of the hollow tube in the longitudinal direction. As shown in FIG. 3A, the thermoelectric film 64 may then be wound around the hollow tube multiple complete turns so that the thermoelectric film 64 is tightly wrapped around the hollow tube. The second edge 68 of the thermoelectric film 64 may then be attached to the wound surface of the thermoelectric film 64 with the attachment medium 74 (see FIG. 3C). Any adhesive known in the art, such as epoxy, glue, sticky disk, sticky tape or any other sticky substance can be used as the attachment medium 74. The thermoelectric film 64 is wound around the hollow tube in such a way that the oriented cracks 80 are substantially parallel to axes 3 of triad 10.

FIG. 3B is an illustration of the p-type thermoelectric element 20 after completion of the winding and attachment process described above. In some embodiments, a large thermoelectric film 64 is wound on a long hollow tube, and thermoelectric elements of the desired length are cut from the long thermoelectric element. These cut pieces could be of the same or different lengths.

FIG. 3C is a cross-sectional illustration of the p-type thermoelectric element 20 shown in FIG. 3B along plane 3C-3C (a plane parallel to axes 1 and 2). FIG. 3C shows the hollow tube with its external cylindrical surface covered by multiple turns of the thermoelectric film 64 with a plurality of cracks 80. The thermoelectric film 64 is formed by depositing the thermoelectric material 62 on only one side of the flexible substrate 60. As discussed above, attachment medium 74 is used to attach the first edge 66 of thermoelectric film 64 to the hollow tube, and the second edge 67 to the wound cylindrical surface of the thermoelectric film 64.

In alternative embodiments, the thermoelectric film 64 may be formed by depositing the thermoelectric material 62 on both sides of the flexible substrate 60. In addition, the plurality of cracks 80 may be present in the thermoelectric material 62 on only one side of the flexible substrate 60, or the cracks 80 may be present on the thermoelectric material 62 on both sides of the flexible substrate 60. The thermoelectric element 20 may then be formed from the thermoelectric film 64 in the same manner as described above.

N-type thermoelectric elements 30 with a plurality of cracks 80 oriented along the longitudinal axis (axis 3 of triad 10) of each thermoelectric element may be formed in the same manner as the p-type thermoelectric elements 20 described above, except that a thermoelectric material 62 of n-type is deposited on the flexible substrate 60 to form the thermoelectric film 64.

The thicknesses of the flexible substrate 60 and thermoelectric material 62 can be any value that meets the performance characteristics of the thermoelectric device 50. For some thermoelectric device applications, the thickness of the flexible substrate 60 may be between approximately 7 and approximately 30 microns, and the thickness of the thermoelectric material 62 may be between approximately 2 and approximately 20 microns. In other thermoelectric device applications, the thermoelectric material layer 62 may be made of multiple layers of the same or different thermoelectric material and the total thickness of the thermoelectric material 62 may range from approximately 1 micron to approximately 15 microns. The size and thickness of the cracks 80 can also be of any value. Some of the cracks 80 may traverse substantially the entire thickness of the thermoelectric material 62, while some cracks 80 may only extend part way into the thickness of the thermoelectric material 62. In some cases, some of the cracks may be substantially parallel to each other. It is also contemplated that in some cases, multiple cracks 80 may join and proceed as one crack.

Figure 4:
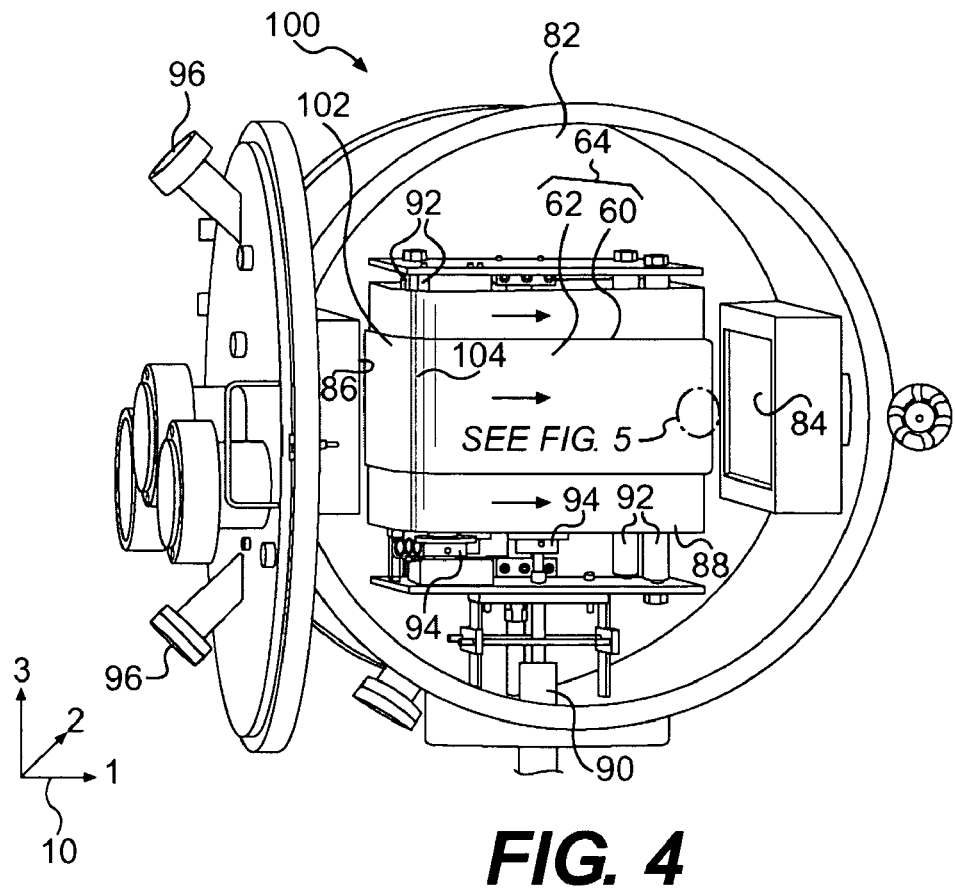
FIG. 4 illustrates an exemplary process for creating a thermoelectric film with multiple oriented cracks that may be used in the thermoelectric element of FIGS. 3A-3C.

FIG. 4 illustrates an exemplary process of creating the thermoelectric film 64, with multiple cracks 80 oriented in one direction, for use in the thermoelectric device 50 of FIG. 2. Deposition of the thermoelectric material 62 on the flexible substrate 60 is carried using a Physical Vapor Deposition (PVD). In the embodiment of the PVD reactor 100 depicted in FIG. 4, a conveyor belt 88 is placed over four rollers 92 placed in a rectangular pattern within a coating chamber 82 of the reactor. The conveyor belt 88 is mechanically coupled to a drive shaft 90 through gears 94. The drive shaft 90 and the gears 94 drive the conveyor belt 88 over the rollers 92 in a rectangular path (with the four rollers as the vertices) with axis of rotation parallel to axis 3 of triad 10. A strip of flexible substrate 60 is snugly wrapped around and attached to the conveyor belt 88. Any attachment mechanism, such as an adhesive, double sided tape, fasteners, etc., may be used to attach the flexible substrate 60 on the conveyor belt 88. Two sputter targets 84 and 86 are provided in the coating chamber 82. The sputter targets serve as the source for the thermoelectric material 62 to be deposited on the flexible substrate 60. Both sputter targets 84 and 86 may be made of the same material or of different materials. It is contemplated that in some applications more than two sputter targets may be used, while in others only one sputter target may be used. The PVD reactor 100 may include other features, such as conduits 96, and may be configured to perform other functions (such as depressurization, inputting one or more gases, heating, electrical biasing, etc.) that are typical of PVD systems known in the art.

Deposition of the thermoelectric material 62 on the flexible substrate 60 may be carried out in the coating chamber 82 using conventional sputter deposition techniques. During sputter deposition, ion bombardment of the targets release atoms of the target material which may get deposited on the surface of the flexible substrate 60. During the deposition process, the flexible substrate 60 attached to the conveyor belt 88 may be driven around the rectangular path. When a portion of the flexible substrate 60 reaches location 102 in the rectangular path, that portion becomes proximate to sputter target 86. Atoms of the material of target 86 may deposit on the portion of the flexible substrate 60, proximate to target 86. These deposited atoms may form a thin layer of thermoelectric material 62 on that portion of the flexible substrate 60. When the portion of flexible substrate 60 with the thin layer of thermoelectric material 62 travels to location 104, the flexible substrate 60 along with the thermoelectric material 62 may get flexed. This flexing action may cause the thin layer of thermoelectric material 62 to crack. Since the thermoelectric material 62 along the entire width of the flexible substrate 60 at location 104 is bend, the cracks 80 may be oriented along axis 3 of triad 10. Similarly, every portion of the flexible substrate 60 with a thin layer of thermoelectric material 62, deposited from sputter target 86, gets cracked as it travels through location 104. When the flexible substrate 60 with the cracked thermoelectric material 62 gets proximate to sputter target 84, a fresh layer of thermoelectric material 62 of sputter target 84 gets deposited on top of the previously cracked layer of thermoelectric material 62. This fresh layer of thermoelectric material 62 may also get cracked (as described previously) when the flexible substrate 60 gets bend as it changes direction while traveling over the next roller 92. Thus each layer of thermoelectric material 62 that gets deposited on the flexible substrate 60 gets cracked. These cracks together form the oriented cracks 80.

It is contemplated that other designs of deposition system and the conveyor belt 88 may be used in some applications. For instance, deposition and cracking of the thermoelectric material 62 may be carried out on a stretch of flexible substrate 60 that is being unwound from one roll and wound in another roll within the coating chamber 82. The oriented cracks 80 may be induced in the deposited thermoelectric layer 62 by flexing the flexible substrate 60 over a roller (or some other mechanism) while traveling from one roll to the other. Although the process described herein is a PVD process, it is contemplated that other deposition processes may be used to deposit the thermoelectric material 62 on the flexible substrate 60.

Figure 5:
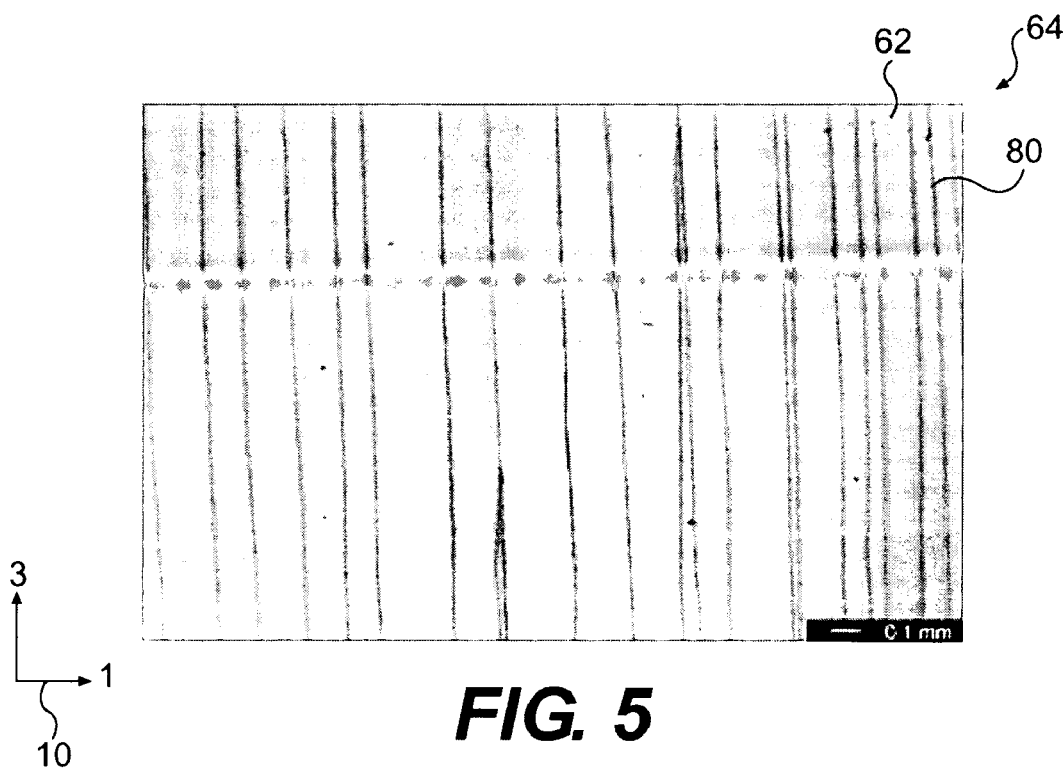
FIG. 5 is a photograph of an exemplary thermoelectric film with multiple oriented cracks created using the process of FIG. 4.

FIG. 5 shows a microscopic photograph of the surface of a thermoelectric material 62 deposited on a flexible substrate 60 (thermoelectric film 64) formed using the system of FIG. 4. The surface of the thermoelectric film 64 show oriented cracks 80 that are substantially parallel to each other. The orientation of the cracks 80 are along axis 3 of triad 10.

INDUSTRIAL APPLICABILITY

The disclosed thin film on a flexible substrate 60 with oriented cracks 80 can be used for any application where a thin film on a flexible substrate 60 can be used. In any application, the cracks 80 can be oriented in a direction that will minimize impact on performance. For example, oriented cracks 80 can be formed on conductive films of flexible electrical circuits that are used in electronic packages. These cracks 80 may be oriented to be parallel to the direction of electrical current, to minimize the impact of the cracks 80 on the electrical resistivity of the conductive film.

To illustrate an application of a thin film on a flexible substrate 60 with oriented cracks 80, an example case of a brittle thermoelectric film on a flexible substrate 60, used in a thermoelectric device 50, will be described. The intentional creation of cracks 80 with a predetermined orientation in the brittle thin film during deposition will prevent randomly oriented cracks from forming in the brittle thin film due to flexure of the flexible substrate 60. The disclosed process of cracking induces cracks 80 in the deposited film, layer by layer. The thickness of a thermoelectric material layer that is cracked at one time is small. Cracking a thin layer of thermoelectric material 62 allows the crack to propagate along the predetermined direction of the bent. If cracks 80 were induced after depositing all the thermoelectric material layers, the crack may propagate uncontrollably in all directions. This method of gradually building up oriented cracks 80 in the film prevents the cracks 80 from propagating in random directions. Orienting the cracks 80 in one direction enables a user to ensure that the cracks 80 are oriented in a direction that will cause minimal impact in any application of the thin film on a flexible substrate 60.

Deposition of the thermoelectric material 62 on the flexible substrate 60 may be carried using PVD as described earlier. Kapton® tape may be used as the flexible substrate 60. The Kapton® tape may be snugly affixed to the conveyor belt 88, and sputter deposition may be carried out using two sputter targets 84 and 86. Sputter target 84 may be made of a stochiometry of boron carbide having the chemical formula $B_4C$, and the other sputter target 86 may be made of a different stochiometry of boron carbide having the chemical formula $B_9C$. The deposition conditions and the conveyor belt speed may be adjusted to deposit different thicknesses of boron carbide (thermoelectric material 62). In some applications, a layer of boron carbide, approximately 1 nanometer to approximately 20 nanometer thick, is deposited every time the Kapton® tape (flexible substrate 60) passes by a sputter target 84, 86. Thus, when a portion of flexible substrate 60 passes by sputter target 84, a layer of $B_4C$ gets deposited on the flexible substrate 60. When the portion of the flexible substrate 60 with the deposited $B_4C$ layer passes over a roller 92, cracks 80 are formed on the brittle $B_4C$ layer. These cracks 80 may be oriented along the longitudinal axis of the roller 92. When this portion of the flexible substrate 60 passes by sputter target 86, a layer of $B_9C$ may get deposited atop the layer of $B_4C$ with oriented cracks 80. This layer of $B_9C$ may also get cracked when the flexible substrate 60 passes over a roller 92. Since the longitudinal axes of the rollers 92 are substantially parallel to each other, the cracks 80 that are induced in each individual layer may be oriented in the same direction. In some cases, the cracks 80 may even be induced on top of each other. The deposition process may be continued until the desired number of layers are deposited on the flexible substrate 60. In some applications more than approximately 100 layers of thermoelectric material 62 may be deposited on the flexible substrate 60. The deposition procedure described herein may produce thermoelectric material 62 layers having a quantum well structure on the flexible substrate 60. The cracks 80 induced in the layers of deposited thermoelectric material 62 may be substantially parallel to each other (see FIG. 5). These cracks 80 in the thermoelectric material 62 may increase the flexibility of the thermoelectric film 64, and allow the thermoelectric film 64 to be flexed during handling and operation without inducing additional cracks.

The orientation of the cracks 80 in the same direction enables a user to use the thermoelectric film 64 in such a way as to minimize the impact of the cracks 80 on the electrical resistivity (resistivity) of the thermoelectric material 62. Since the cracks 80 are oriented along axes 3 of triad 10, the impact of the cracks 80 to current flow in the same direction (along axis 3 of triad 10, in FIG. 2 and FIGS. 3A-3C) may be minimal. In contrast, the impact of the cracks 80 to current flow in another direction (for instance, along axis 1 of triad 10) may be significant.

Figure 6:
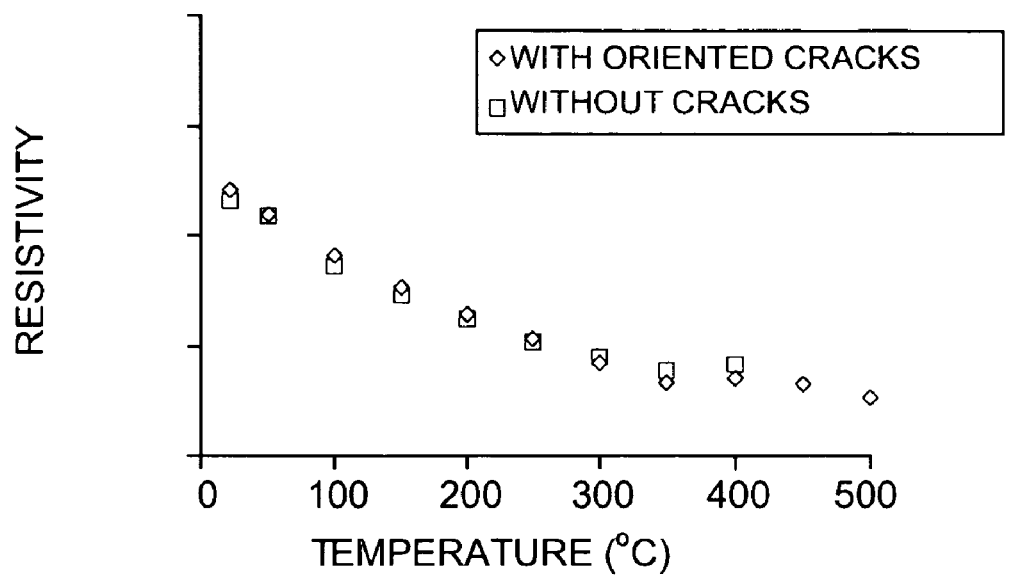
FIG. 6 compares the electrical resistivity of the thermoelectric film of FIG. 5 with an exemplary uncracked thermoelectric film.

FIG. 6 compares the electrical resistivity of the deposited thermoelectric material 62 with oriented cracks 80 to a comparable thermoelectric film without cracks 80. For these measurements, the direction of current flow is along the direction of the oriented cracks 80 (that is, along axis 3 of triad 10 in FIG. 5). As can be seen from FIG. 6, the impact of the oriented cracks 80 on the electrical resistivity of the thermoelectric material 62 is minimal.

Figure 7:
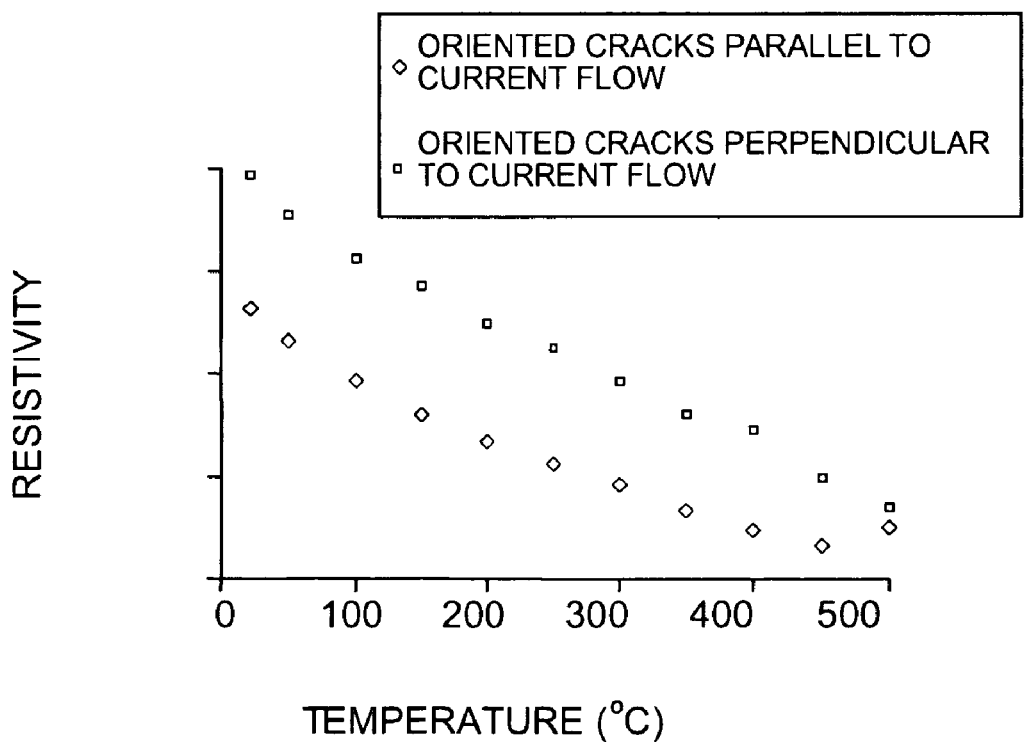
FIG. 7 compares the electrical resistivity of the thermoelectric film of FIG. 5 in a direction parallel to the direction of cracks and in a direction perpendicular to the direction of the cracks.

FIG. 7 compares the electrical resistivity of the deposited thermoelectric material 62 with oriented cracks 80, along two directions. One of these directions correspond to the direction of cracks 80 parallel to the direction of current (along axis 3 of triad 10, in FIG. 5). The other direction corresponds to the direction of cracks 80 perpendicular to the direction of the current (along axis 1 of triad 10, in FIG. 5). As can be seen in FIG. 7, the resistivity of the thermoelectric material 62 to current flow in a direction perpendicular to the direction of the cracks 80 is significantly higher than the resistivity associated with current flow in a direction parallel to the cracks 80. The resistivity of the thermoelectric material 62 in other directions may fall in between these two values. The minimal impact of the cracks 80 to current flow in the direction of the cracks 80 may be due to the relatively small reduction in cross-section area of the thermoelectric material 62 along the direction of current flow.

The flexible substrate 60 with the deposited thermoelectric material 62 (thermoelectric film 64) having oriented cracks 80 may be used to create n-type and p-type thermoelectric elements 30, 20 by winding the thermoelectric film 64 around the hollow tube, as described earlier. During the winding process, the thermoelectric film 64 may be configured such that the cracks 80 are oriented along the longitudinal direction of the hollow tube (along axis 3 of triad 10, in FIG. 3B).

During operation of machine 900, hot and cold regions may be created. Thermoelectric devices 50 may be arranged such opposite parallel end surfaces of the thermoelectric elements are proximate to the hot and cold regions. In this configuration, the p-type and n-type thermoelectric elements 30, 20 may be connected electrically in series and thermally in parallel, with one end surface in the hot region and the other end surface in the cold region. This arrangement of the thermoelectric device 50 creates a potential difference between the parallel end surfaces of the thermoelectric elements, due to the Seebeck effect. This potential difference generates a current (along axis 3 of triad 10 in FIG. 2) when connected to an electrical load.

The thermoelectric device 50 may also be used as a heat pump wherein electrical power is supplied to the thermoelectric device 50 to generate a hot region and a cold region. In such an application, electric power may be fed to the thermoelectric device 50 using the electrically conductive leads 26. The flow of electric current through the thermoelectric elements cause their opposite parallel end surfaces to heat and cool by the Peltier effect.

In both applications of the thermoelectric device 50 (for power production, and as a heat pump), the performance of the thermoelectric device 50 may depend on the cross-sectional area of the thermoelectric material 62 available for heat/current flow. In the configuration of the thermoelectric device 50 described, the cross-sectional area of the thermoelectric material 62 available for heat/current flow corresponds to the area of the thermoelectric material 62 exposed in FIG. 3C. When the cracks 80 are oriented along the longitudinal direction of the hollow tube (along axis 3 of triad 10, in FIG. 3B), the direction of the cracks 80 correspond to the direction of current/heat flow. In this configuration, the decrease in cross-section area due to the cracks 80 is a minimum, and therefore, the adverse impact of the cracks 80 on the performance of the thermoelectric film 64 is also a minimum.

Intentionally inducing cracks 80 in a preferred direction during deposition minimizes the impact of the cracks 80 on the performance of the deposited layer. The presence of the cracks 80 oriented in the same direction will also enable flexing of the flexible substrate 60 without further cracking, thereby increasing the durability of the film.

It will be apparent to those skilled in the art that various modifications and variations can be made to the disclosed thin film with oriented cracks 80 deposited on a flexible substrate 60. Other embodiments will be apparent to those skilled in the art from consideration of the specification and practice of the disclosed thin film with oriented cracks 80 deposited on a flexible substrate 60. It is intended that the specification and examples be considered as exemplary only, with a true scope being indicated by the following claims and their equivalents.

What is claimed is:

1. A thermoelectric film comprising:
   a substrate that is substantially electrically non-conductive and flexible; and
   a thermoelectric material deposited on at least one surface of the substrate, the thermoelectric material including multiple cracks oriented in a predetermined direction, wherein at least some of the multiple cracks extend only part way through a thickness of the thermoelectric material.

2. The thermoelectric film of claim 1, wherein the multiple cracks are oriented in a same general direction.

3. The thermoelectric film of claim 1, wherein the multiple cracks are substantially parallel to each other.

4. The thermoelectric film of claim 1, wherein the thermoelectric material includes multiple layers of thermoelectric material with each layer of thermoelectric material having multiple cracks oriented in the predetermined direction.

5. The thermoelectric film of claim 1, wherein the multiple cracks are oriented substantially only in one direction.

6. The thermoelectric film of claim 1, wherein the multiple cracks are oriented substantially parallel to a direction of an electric current flow.

7. The thermoelectric film of claim 1, wherein a thickness of the thermoelectric material is between approximately 2 microns and approximately 20 microns.

8. The thermoelectric film of claim 1, wherein a thickness of the substrate is between approximately 7 microns and approximately 30 microns.

9. The thermoelectric film of claim 4, wherein each layer of the multiple layers has a thickness between approximately 1 nanometer and approximately 20 nanometers.

10. The thermoelectric film of claim 1, wherein the thermoelectric material includes at least one of boron carbide, silicon carbide, silicon germanium, bismuth telluride, or germanium telluride.

11. A thermoelectric laminate comprising:
    a substrate that is substantially electrically non-conductive and flexible; and
    a film of thermoelectric material on the substrate, the film including, multiple layers of thermoelectric material, wherein each layer has a thickness between approximately 1 nanometer and approximately 20 nanometers, and
    a plurality of induced cracks in at least one of the multiple layers, wherein each crack of the plurality of cracks is oriented in substantially the same direction, and at least some of the plurality of cracks extend only part way through the thickness of the at least one layer.

12. The thermoelectric laminate of claim 11, wherein a thickness of the substrate is between approximately 7 microns and approximately 30 microns.

13. The thermoelectric laminate of claim 11, wherein the thickness of the film is between approximately 2 microns and approximately 20 microns.

14. The thermoelectric laminate of claim 11, wherein the multiple cracks are oriented substantially parallel to a direction of an electric current flow in the thermoelectric sheet.

15. The thermoelectric laminate of claim 11, wherein the thermoelectric material includes at least one of boron carbide, silicon carbide, silicon germanium, bismuth telluride, or germanium telluride.

16. A thermoelectric laminate comprising:
    a substrate that is substantially electrically non-conductive and flexible; and
    a film of a thermoelectric material on at least one surface of the substrate, the film including multiple induced cracks oriented substantially in a direction of an electric current flow in the thermoelectric sheet, wherein at least some of the multiple cracks extend only part way through a thickness of the film.

17. The thermoelectric laminate of claim 16, wherein a thickness of the substrate is between approximately 7 microns and approximately 30 microns, and the thickness of the film is between approximately 2 microns and approximately 20 microns.

18. The thermoelectric laminate of claim 16, wherein the film of thermoelectric material includes multiple layers of thermoelectric material, wherein each layer has a thickness between approximately 1 nanometer and approximately 20 nanometers.

* * * * *